US008055961B2

(12) United States Patent
Goto et al.

(10) Patent No.: US 8,055,961 B2
(45) Date of Patent: Nov. 8, 2011

(54) SEMICONDUCTOR DEVICE TESTING

(75) Inventors: Kenji Goto, Kawasaki (JP); Kazuhide Yoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 198 days.

(21) Appl. No.: 12/484,647

(22) Filed: Jun. 15, 2009

(65) Prior Publication Data

US 2009/0313511 A1 Dec. 17, 2009

(30) Foreign Application Priority Data

Jun. 17, 2008 (JP) ................................. 2008-157597

(51) Int. Cl.
G01R 31/28 (2006.01)
(52) U.S. Cl. .................... 714/726; 714/733; 714/736
(58) Field of Classification Search .................. 714/726, 714/727, 733, 736
See application file for complete search history.

(56) References Cited

U.S. PATENT DOCUMENTS

| 4,897,837 | A | * | 1/1990 | Ishihara et al. | 714/726 |
|---|---|---|---|---|---|
| 5,568,437 | A | * | 10/1996 | Jamal | 365/201 |
| 6,088,823 | A | * | 7/2000 | Ayres et al. | 714/733 |
| 6,327,683 | B1 | * | 12/2001 | MacCormack | 714/726 |
| 6,574,762 | B1 | * | 6/2003 | Karimi et al. | 714/727 |
| 6,650,583 | B2 | * | 11/2003 | Haraguchi et al. | 365/201 |
| 6,829,728 | B2 | * | 12/2004 | Cheng et al. | 714/30 |
| 2002/0071326 | A1 | | 6/2002 | Suzuki | |
| 2007/0168809 | A1 | * | 7/2007 | Kiryu et al. | 714/733 |

FOREIGN PATENT DOCUMENTS

| JP | H11-65872 | 3/1999 |
|---|---|---|
| JP | 2002-32998 | 1/2002 |
| JP | 2006-004509 | 1/2006 |

* cited by examiner

Primary Examiner — Jeffrey A Gaffin
Assistant Examiner — Steve Nguyen
(74) Attorney, Agent, or Firm — Fujitsu Patent Center

(57) ABSTRACT

A semiconductor device test circuit includes a data producing unit to produce first test data to be fed into a semiconductor device, and expected value data; a first data retaining unit to retain the first test data, and feed the first test data into the semiconductor device; a second data retaining unit to retain the expected value data; a comparison unit to compare output data outputted through the first data retaining unit and the expected value data outputted from the second data retaining unit to supply data indicating comparison result between the output data and the expected value data; and a switching unit to switch the data fed into the second data retaining unit between the expected value data and the output data, wherein the first data retaining unit and the second data retaining unit form parts of a scan chain into which second test data may externally be fed.

7 Claims, 2 Drawing Sheets

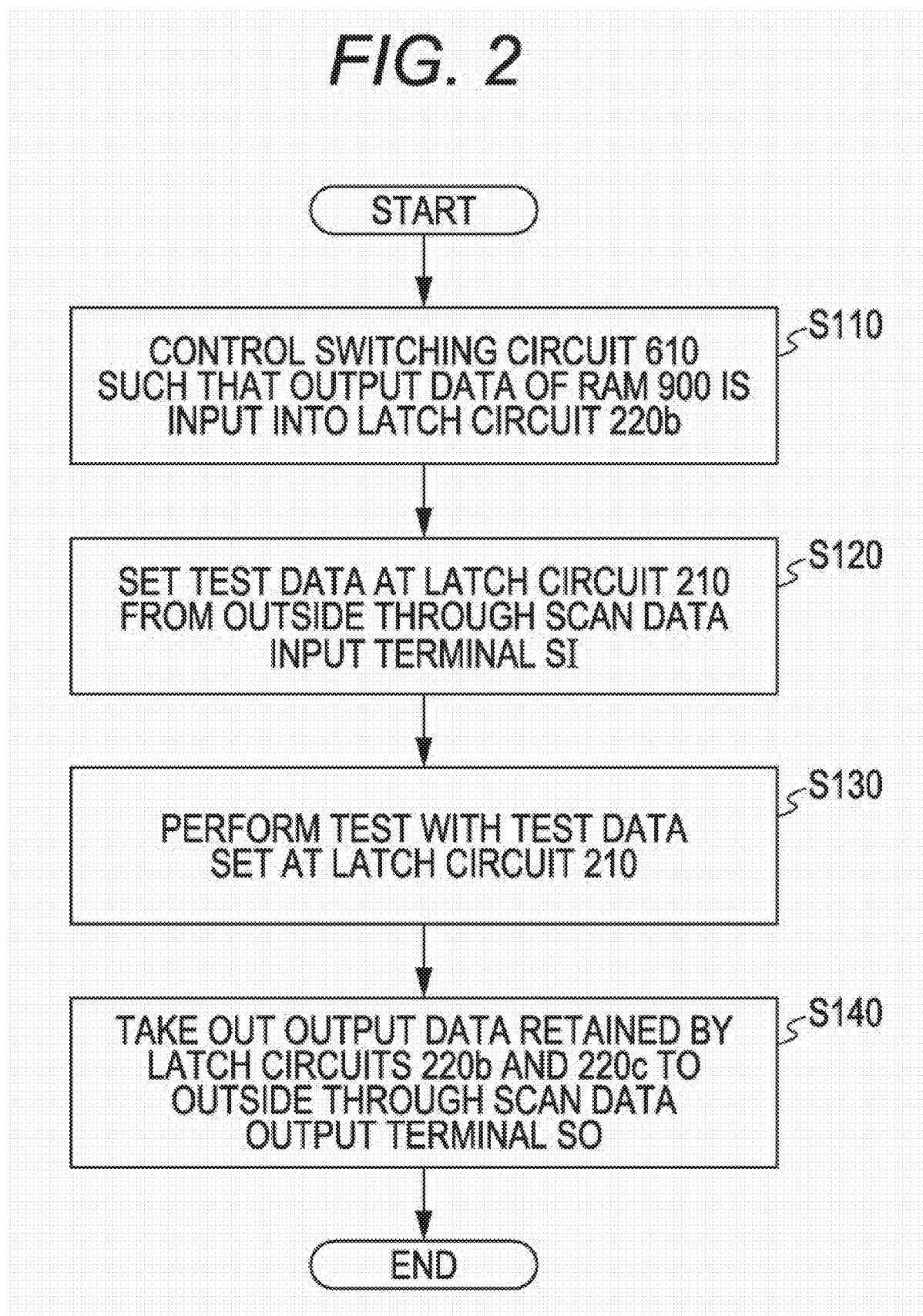

US 8,055,961 B2

SEMICONDUCTOR DEVICE TESTING

CROSS-REFERENCE TO RELATED APPLICATIONS

This application is based upon and claims the benefit of priority of the prior Japanese Patent Application No. 2008-157597, filed on Jun. 17, 2008, the entire contents of which are incorporated herein by reference.

FIELD

Embodiments of the present invention discussed herein relate to a semiconductor device. For example, the invention may be applied to a technique of testing a semiconductor memory device such as a Random Access Memory (RAM).

BACKGROUND

A method in which a BIST (Built-In Self Test) circuit is used is well known as the method for testing the semiconductor memory device, such as RAM, that is built in a semiconductor integrated circuit such as LSI (Large Scale Integration) (for example, see Japanese Patent Publication Laid-Open Nos. 2006-4509, 2002-32998, and 11-65872). Such method is hereinafter appropriately referred to as "BIST testing." The BIST circuit is built in the semiconductor integrated circuit in advance. The BIST circuit includes a data generation circuit that automatically produces a test pattern, and a comparison circuit that compares an expected value and an output from the semiconductor memory device. In the BIST testing, the expected value and the output data from the semiconductor memory device into which the test pattern produced by the data generation circuit are compared, and a test result indicating whether or not a defect is occurred in the semiconductor memory device is supplied to an LSI tester or the like based on a result of the comparison.

Another method in which a scan test circuit including plural scan flip-flops forming a scan path or a scan chain is used is well known as the method for testing the semiconductor memory device (for example, see Japanese Patent Publication Laid-Open Nos. 2006-4509 and 2002-32998). Such method is hereinafter appropriately referred to as "scan test." The scan test circuit is built in the semiconductor integrated circuit in advance. In the scan test, after the test pattern supplied from the outside of the semiconductor memory device is retained by an input-side scan flip-flop of the semiconductor memory device through the scan path, the test pattern is fed into the semiconductor memory device. Further, the output data from the semiconductor memory device is retained by an output-side scan flip-flop of the semiconductor memory device. Thus, determination whether or not the defect is generated semiconductor memory device is made by taking out the output data retained by the scan flip-flop to the outside through the scan path.

In the BIST testing, the data pattern is automatically produced by the BIST circuit, more specifically by the data generation circuit forming a part of the BIST circuit, so that the semiconductor memory device can be tested for a shorter time then that of the scan test. However, because the BIST testing is limited to a range of the test pattern automatically produced by the BIST circuit, various tests of the semiconductor memory device are hardly performed compared with the scan test, in which any test pattern can externally be fed into the semiconductor memory device.

In other words, in the scan test, although any test pattern can be fed into the semiconductor memory device from the outside, many test patterns are hardly fed into the semiconductor memory device to perform the test compared with the BIST testing in which the test pattern is automatically produced.

On the other hand, in the test circuit that is built in the semiconductor integrated circuit to test the semiconductor memory device, desirably a circuit area or a circuit size of the test circuit is reduced as much as possible.

In view of the foregoing, an object of embodiments of the invention is to provide a semiconductor device that can perform both the BIST testing and the scan test without increasing the circuit area.

SUMMARY

In view of the foregoing, at least one embodiment of the present invention provides a semiconductor device that may perform both the BIST testing and the scan test without increasing the circuit area.

Accordingly, in one embodiment of the present invention, a semiconductor device test circuit includes a data producing unit to produce first test data to be fed into a semiconductor device, and expected value data; a first data retaining unit to retain the first test data, and feed the first test data into the semiconductor device; a second data retaining unit to retain the expected value data; a comparison unit that compares output data outputted through the first data retaining unit and the expected value data outputted from the second data retaining unit to supply data indicating comparison result between the output data and the expected value data; and a switching unit to switch the data fed into the second data retaining unit between the expected value data and the output data, wherein the first data retaining unit and the second data retaining unit form parts of a scan chain into which second test data may externally be fed.

BRIEF DESCRIPTION OF DRAWINGS

FIG. 2 is a flowchart illustrating a scan test performed by a semiconductor memory device test circuit according to an example of an embodiment of the present invention.

DESCRIPTION OF EMBODIMENTS

Figure 1:
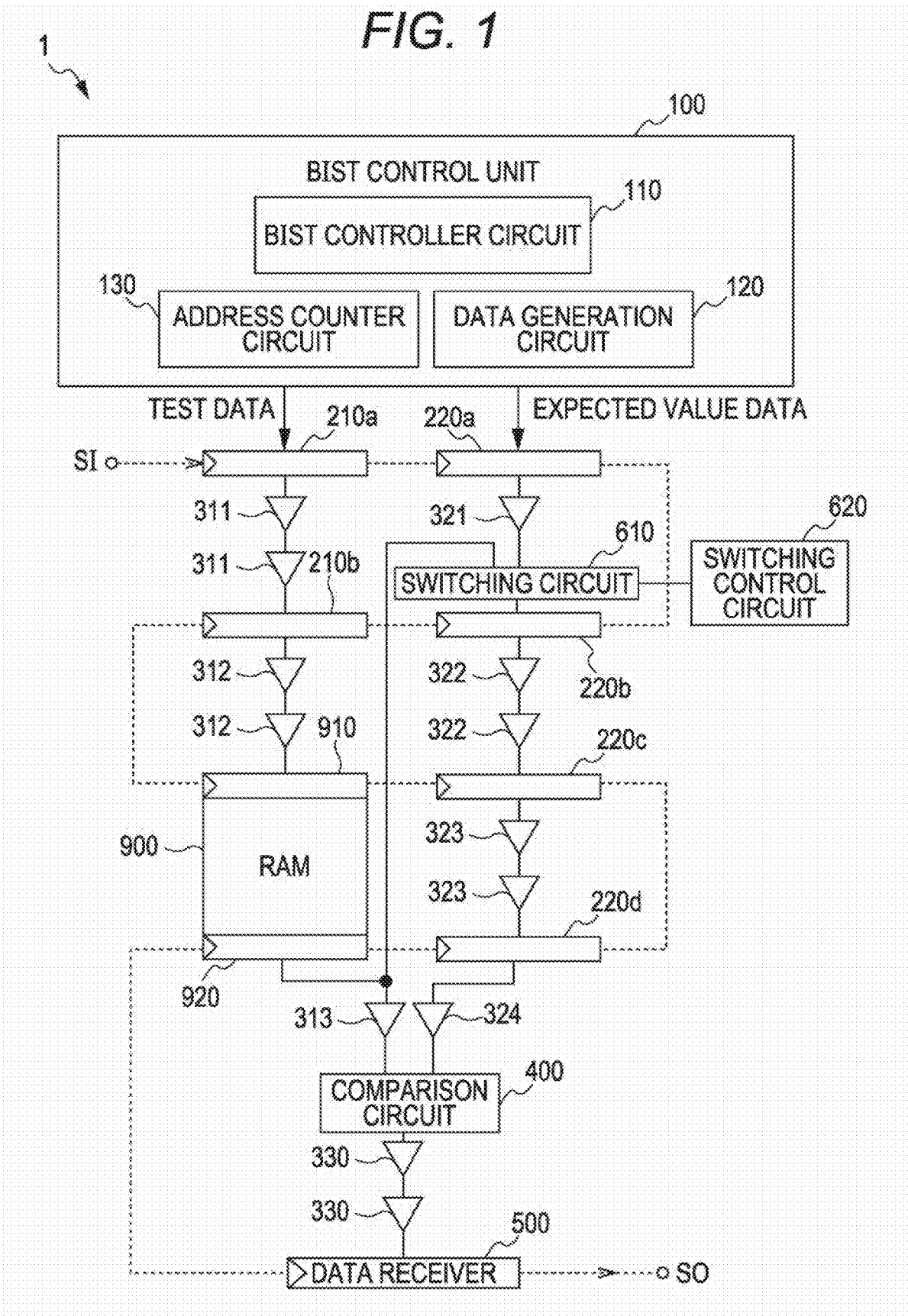
FIG. 1 is a block diagram illustrating a semiconductor memory device test circuit according to an example of an embodiment of the present invention.

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present. Like reference numerals refer to like elements throughout.

Referring to FIG. 1, a semiconductor memory device test circuit 1 is built in a semiconductor integrated circuit having RAM 900. RAM 900 is an example of the "semiconductor memory device." The semiconductor memory device test circuit 1 and RAM 900 of FIG. 1 are parts of a one-chip semiconductor integrated circuit.

The semiconductor memory device test circuit 1 includes a BIST control unit 100, latch circuits 210*a* and 210*b*, latch circuits 220*a*, 220*b*, 220*c*, and 220*d*, a comparison circuit 400, a data receiver 500, delay gates 311, 312, 313, 321, 322, 323, 324, and 330, a switching circuit 610, and a switching control circuit 620. At this point, the latch circuits 210a and 210b are also collectively referred to as "latch circuit 210". The latch circuits 220a, 220b, 220c, and 220d are collectively referred to as "latch circuit 220". The latch circuit 210 is an example of the "first data retaining unit", and the latch circuit 220 is an example of the "second data retaining unit".

The BIST control unit 100 includes a BIST controller circuit 110, a data generation circuit 120, and an address counter circuit 130.

The BIST controller circuit 110 controls operations of the data generation circuit 120, address counter circuit 130, and comparison circuit 400. When the semiconductor memory device test circuit 1 performs a BIST testing, the BIST controller circuit 110 controls the operation of each of the data generation circuit 120, the address counter circuit 130, and the comparison circuit 400.

The data generation circuit 120 is an example of the "data producing unit". The data generation circuit 120 automatically produces plural pieces of test data or plural test patterns, or expected value data corresponding to test data/test pattern. When the semiconductor memory device test circuit 1 performs the BIST testing, the test data produced by the data generation circuit 120 is fed into the latch circuit 210, and the expected value data produced by the data generation circuit 120 is fed into the latch circuit 220.

The latch circuit 210 and the latch circuit 220 include scan flip-flops, respectively. The latch circuit 210 and the latch circuit 220 partially constitute a scan chain or a scan path along with an input-side latch 910, an output-side latch 920, and the data receiver 500. In FIG. 1, a pathway of the scan chain is indicated by a broken line. A configuration of the scan chain is described in detail later.

The latch circuit 210 sequentially retains the pieces of test data supplied from the BIST control unit 100. When the semiconductor memory device test circuit 1 performs the BIST testing, the pieces of test data supplied from the BIST control unit 100 are sequentially transferred to the latch circuits 210a and 210b, and the pieces of test data are fed into the input-side latch 910. The input-side latch 910 is provided on the input side of RAM 900, and the input-side latch 910 includes the scan flip-flop.

The latch circuit 220 sequentially retains the pieces of expected value data supplied from the BIST control unit 100. When the semiconductor memory device test circuit 1 performs the BIST testing, the pieces of expected value data supplied from the BIST control unit 100 are sequentially transferred to the latch circuits 220a, 220b, 220c, and 220d, and the pieces of expected value data are fed into the comparison circuit 400.

The comparison circuit 400 is an example of the "comparison unit". The comparison circuit 400 compares data supplied from RAM 900, more specifically from the output-side latch 920 including scan flip-flop provided on the output side of RAM 900 and the expected value data supplied from the BIST control unit 100 through the latch circuit 220. The comparison circuit 400 supplies comparison result data indicating the comparison result. The comparison result data indicates whether or not the data supplied from RAM 900 is matched with the expected value data, that is, whether or not mismatch exists between the output data and the expected value data.

The data receiver 500 includes a scan flip-flop. The data receiver 500 retains the comparison result data supplied from the comparison circuit 400.

The delay gates 311 to 313, 321 to 324, and 330 include buffer circuits, respectively. The delay gates 311 to 313, 321 to 324, and 330 delay a data propagation time by a certain time. The delay gate 311 is provided between the latch circuits 210a and 210b. The delay gate 312 is provided between the latch circuit 210b and RAM 900, more particularly between the latch circuit 210b and the input-side latch 910. The delay gate 313 is provided between RAM 900 and the comparison circuit 400, more particularly between the output-side latch 920 and the comparison circuit 400. The delay gate 321 is provided between the latch circuits 220a and 220b, more particularly between the latch circuit 220a and the switching circuit 610. The delay gate 322 is provided between the latch circuits 220b and 220c. The delay gate 323 is provided between the latch circuits 220c and 220d. The delay gate 324 is provided between the latch circuit 220d and the comparison circuit 400. The delay gate 330 is provided between the comparison circuit 400 and the data receiver 500. The delay gates 311 and 312 are an example of the "first delay unit", and the delay gates 321, 322, and 323 are an example of the "second delay unit".

The latch circuits 210 and 220, the input-side latch 910, the output-side latch 920, and the data receiver 500 partially form the scan chain as shown by a broken line of FIG. 1. In addition to an input terminal and an output terminal in a normal operation, each of the scan flip-flops (which are parts of the latch circuits 210 and 220, the input-side latch 910, the output-side latch 920, and the data receiver 500) includes a scan-in terminal that serves as an input terminal in a scan operation and a scan-out terminal that serves as an output terminal in the scan operation. The scan-out terminal of each of the scan flip-flops is connected to the scan-in terminal of another scan flip-flop, thereby connecting the scan flip-flops in series.

The scan-out terminal of the latch circuit 210a is connected to the scan-in terminal of the latch circuit 220a, and the scan-out terminal of the latch circuit 220a is connected to the scan-in terminal of the latch circuit 220b. The scan-out terminal of the latch circuit 220b is connected to the scan-in terminal of the latch circuit 210b, and the scan-out terminal of the latch circuit 210b is connected to the scan-in terminal of the input-side latch 910. The scan-out terminal of the input-side latch 910 is connected to the scan-in terminal of the latch circuit 220c, and the scan-out terminal of the latch circuit 220c is connected to the scan-in terminal of the latch circuit 220d. The scan-out terminal of the latch circuit 220d is connected to the scan-in terminal of the output-side latch 920, and the scan-out terminal of the output-side latch 920 is connected to the scan-in terminal of the data receiver 500.

A scan data input terminal SI is connected to the scan-in terminal of the latch circuit 210a. In the scan chain illustrated in FIG. 1, the data may be fed from the outside through the scan data input terminal SI. A scan data output terminal SO is connected to the scan-out terminal of the data receiver 500. In the scan chain of FIG. 1, the data may be supplied to the outside through the scan data output terminal SO.

Arbitrary data is supplied from the outside through the scan data input terminal SI by the scan chain of FIG. 1, and the pieces of data may be retained in the latch circuits 210 and 220, the input-side latch 910, the output-side latch 920, and the data receiver 500.

In the scan chain of FIG. 1, the pieces of data retained in the latch circuits 210 and 220, the input-side latch 910, the output-side latch 920, and the data receiver 500 may be supplied to the outside through the scan data output terminal SO. The latch circuits 210 and 220, the input-side latch 910, the output-side latch 920, and the data receiver 500, which form the scan chain, act as a shift register that sequentially retains and supplies the data fed from the outside through the scan data input terminal SI based on a clock signal.

In FIG. 1, the switching circuit 610 is an example of the "switching unit". The switching circuit 610 includes a switching element. The switching circuit 610 switches the data fed into the latch circuit 220b between the data supplied from the latch circuit 220a through the delay gate 321 and the data supplied from RAM 900. Instead of the expected value data supplied from the BIST control unit 100, the data supplied from RAM 900 may be fed into the latch circuit 220b by the switching operation of the switching circuit 610.

The switching control circuit 620 is an example of the "switching control unit". The switching control circuit 620 selectively switches the switching circuit 610 according to a control signal supplied from the outside. For example, the switching control circuit 620 switches the switching circuit 610 such that the data supplied from RAM 900 is fed into the latch circuit 220b according to the control signal that is included in the test data fed from the outside through the scan data input terminal SI, for example, the signal indicating the scan test. Alternatively, the control signal for controlling the switching operation of the switching circuit 610 may directly be fed into the switching circuit 610 without providing the switching control circuit 620.

Thus, in the semiconductor memory device test circuit 1, when testing RAM 900, the switching circuit 610 switches the data fed into the latch circuit 220b between the expected value data and the data supplied from RAM 900, so that both the BIST testing and the scan test may be performed.

When performing the BIST testing, the switching control circuit 620 causes the switching circuit 610 to switch to the side of the latch circuit 220a such that the expected value data is fed into the latch circuit 220b. The BIST control unit 100 sequentially and automatically produces the test data and the expected value data. The test data produced by the BIST control unit 100 is sequentially retained by the latch circuits 210a and 210b, and the test data is fed into RAM 900. The data supplied from RAM 900 is fed into the comparison circuit 400. On the other hand, expected value data produced by the BIST control unit 100 is sequentially retained by the latch circuits 220a, 220b, 220c, and 220d, and the reference value data is fed into the comparison circuit 400.

The comparison circuit 400 produces comparison result data indicating whether or not the data supplied from RAM 900 is matched with the expected value data supplied through the latch circuit 220. The comparison result data produced by the comparison circuit 400 is supplied to the data receiver 500, and the data receiver 500 retains the comparison result data. The comparison result data retained in the data receiver 500 may be taken out to the outside through the scan data output terminal SO by the scan operation in which the scan chain is used. Thus, the semiconductor memory device test circuit 1 may perform the BIST testing, in which the BIST control unit 100 automatically produces the test data and the expected value and the comparison circuit 400 compares the data supplied from RAM 900 and the reference value data to produce the comparison result data.

FIG. 2 is a flowchart illustrating the scan test performed by a semiconductor memory device test circuit.

In performing the scan test, the switching control circuit 620 causes the switching circuit 610 to switch the side of the latch circuit 920 such that the output data supplied from RAM 900 is fed into the latch circuit 220b (S110).

The test data is set in the latch circuit 210 from the outside through the scan data input terminal SI (S120). The test data fed through the scan data input terminal SI is transferred on the scan chain, thereby retaining the test data in each of the latch circuits 210a and 210b. That is, by using the scan chain into which the test data may be fed from the outside through the scan data input terminal SI, the latch circuit 210a retains the test data having the first test pattern while the latch circuit 210b retains the test data having the second test pattern. At this point, the test data fed from the outside through the scan data input terminal SI may be arbitrarily set by a tester that is provided outside. Therefore, the pieces of test data except for the test data produced by the BIST control unit 100 are set in the latch circuit 210, so that various tests may be performed to RAM 900.

The test is performed with the pieces of test data set in the latch circuits 210a and 210b (S130). That is, the pieces of test data retained in the latch circuits 210a and 210b are sequentially transferred to RAM 900, and the pieces of data sequentially supplied from RAM 900 are retained in the latch circuits 220b and 220c. As described above, at S110, the switching control circuit 620 switches the switching circuit 610 onto the side of the latch circuit 920 such that the data supplied from RAM 900 is fed into the latch circuit 220b, so that the pieces of data sequentially supplied from RAM 900 can be retained in the latch circuits 220b and 220c.

The pieces of data retained in the latch circuits 220b and 220c are taken out to the outside of the circuit illustrated in FIG. 1 from the scan data output terminal SO (S140). That is, the pieces of data retained in the latch circuits 220b and 220c are transferred on the scan chain, whereby the pieces of data retained in the latch circuits 220b and 220c are supplied to the outside through the scan data output terminal SO. The determination whether or not the defect is generated in RAM 900 may be made by analyzing the data taken out to the outside, and therefore the detailed analysis of the defect in RAM 900 may be made. Thus, the semiconductor memory device test circuit 1 may perform the scan test in which the pieces of test data are set in the latch circuits 210a and 210b using the scan chain.

The provision of the switching circuit 610 may retain the expected value data in the latch circuit 220b during the BIST testing while retaining the data supplied from RAM 900 in the latch circuit 220b during the scan test. Therefore, it is not necessary to separately provide the latch circuit in which the expected value data is retained in performing the BIST testing and the latch circuit in which the data supplied from RAM 900 is retained in performing the scan test. In other words, it is not necessary to add the latch circuit used to perform only the scan test in addition to the latch circuit that is provided in the typical BIST circuit to retain the test data or expected value data therein for example, the latch circuits 210 and 220. Therefore, the enlargement of the circuit area can be suppressed compared with the case in which both the typical BIST circuit and scan test circuit are simply formed in the semiconductor integrated circuit without taking a countermeasure.

Further, the switching circuit 610 and one delay gate 321 are provided between the latch circuits 220a and 220b. Each data delay time is adjusted in the switching circuit 610 and delay gate 321 that are provided between the latch circuits 220a and 220b and the two delay gates 311 that are provided between the latch circuits 210a and 210b such that a difference between the data delay time between the latch circuits 220a and 220b and the data delay time between the latch circuits 210a and 210b are decreased or substantially reduced or eliminated. Therefore, the test data and expected value data that are supplied from the BIST control unit 100 may be transferred in the substantially or completely same timing to suitably perform the test of RAM 900.

As described above, the switching circuit 610 and one delay gate 321 are provided between the latch circuits 220a and 220b, so that the substantial enlargement of the circuit area is not generated compared with the case in which the two delay gates 321 are provided while the switching circuit 610 is not provided between the latch circuits 220a and 220b.

The switching circuit 610 is provided between the latch circuits 220a and 220b, the data supplied from RAM 900 is fed into the latch circuit 220b instead of the reference value data supplied from the BIST control unit 100 by the switching operation of the switching circuit 610. However, the disposition of the switching circuit 610 is not limited as noted above. For example, the switching circuit 610 may be provided between the BIST control unit 100 and the latch circuit 220a, and the output data is fed into the latch circuit 220a from RAM 900 by the switching operation of the switching circuit 610, or the switching circuit 610 may be provided between the latch circuits 220b and 220c and the output data is fed into the latch circuit 220c from RAM 900 by the switching operation of the switching circuit 610. At this point, desirably the number of latch circuits 220 provided between the switching circuit 610 and the comparison circuit 400 is substantially equal to or larger than the number of latch circuits 210 provided between the BIST control unit 100 and RAM 900. In such cases, during the scan test, the data supplied from RAM 900 may securely be retained in the latch circuit 220 provided between the switching circuit 610 and the comparison circuit 400. The number of latch circuits 210 provided between the BIST control unit 100 and RAM 900 is not limited to two, but one or at least three latch circuits 210 may be provided according to the number of pieces of test data that should be retained in the semiconductor memory device test circuit.

As described above, the semiconductor memory device test circuit 1 may perform both the BIST testing and the scan test without enlarging the circuit area.

In a semiconductor device containing the semiconductor memory device test circuit 1, both the BIST testing and the scan test can be performed without enlarging the circuit area.

In testing the semiconductor memory device, the switching unit switches the data fed into the second data retaining unit between the expected value data and the data supplied from the semiconductor memory device, so that both the BIST testing and the scan test may be performed with the same circuit. That is, the semiconductor device acts as both the BIST circuit and the scan test circuit. Further, it is not necessary to separately provide the data retaining unit in which the expected value data is retained in performing the BIST testing and the data retaining unit in which the data supplied from the semiconductor memory device in performing the scan test. In other words, it is not necessary to add the data retaining unit used to perform only the scan test. Therefore, the semiconductor device may perform both the BIST testing and the scan test without enlarging the circuit area.

What is claimed is:

1. A semiconductor device test circuit which tests a semiconductor device, comprising:
   a data producing unit that produces first test data and expected value data, the first test data to be fed into the semiconductor device, the expected value data represents expected normal output data supplied from the semiconductor device according to the first test data;
   a first data retaining unit that retains the first test data produced by the data producing unit and to feed the first test data into the semiconductor device;
   a second data retaining unit that retains the expected value data produced by the data producing unit;
   a comparison unit that compares the first test data fed through the semiconductor device and the expected value data outputted from the second data retaining unit to supply comparison result data indicating comparison result between the first data and the expected value data;
   a switching unit operable that switches the data to be fed into the comparison unit through the second data retaining unit between the expected value data fed from the data producing unit and the first test data fed through the semiconductor device; and
   a scan chain that includes the first data retaining unit and the second data retaining unit, wherein the scan chain is fed with second test data that is external to the semiconductor device test circuit.

2. The semiconductor device test circuit according to claim 1, wherein the plurality of first data retaining units are provided so as to sequentially retain the first test data,
   the plurality of second data retaining units are provided to sequentially retain the expected value data, and
   the semiconductor device test circuit further includes,
   a plurality of first delay unit that are provided between adjacent first data retaining units in the plurality of first data retaining units that delays data propagation between the adjacent first data retaining units; and
   a plurality of second delay unit that are provided between adjacent second data retaining units in the plurality of second data retaining units that delays data propagation between the adjacent second data retaining units.

3. The semiconductor device test circuit according to claim 2, wherein the switching unit and one of the plurality of second delay units are provided between the adjacent second data retaining units.

4. The semiconductor device test circuit according to claim 2, wherein a data delay time is adjusted in each of the plurality of first delay units, the plurality of second delay units, and the switching unit such that a difference between a data delay time between the adjacent first data retaining units and a data delay time between the adjacent second data retaining units is decreased.

5. The semiconductor device test circuit according to claim 1, wherein the semiconductor device is a semiconductor memory device.

6. The semiconductor device test circuit according to claim 1, wherein the semiconductor device further includes a switching control unit that selectively switches the switching unit according to an externally fed control signal.

7. A semiconductor device comprising:
   a memory unit in which information is stored;
   a data producing unit that produces first test data and expected value data, the first test data to be fed into the semiconductor device, the expected value data represents expected normal output data of the memory unit according to the first test data;
   a first data retaining unit in which the first test data produced by the data producing unit is retained;
   a second data retaining unit in which the expected value data produced by the data producing unit is retained;
   a comparison unit that compares output data and the expected value data to supply comparison result data indicating comparison result between the output data and the expected value data, the output data being output of the memory unit into which the first test data retained by the first data retaining unit is fed, the expected value data being retained by the second data retaining unit; and
   a switching unit operable to switch the data to be fed into the comparison unit through the second data retaining unit between the expected value data fed from the data producing unit and the output data from the memory unit.

* * * * *